United States Patent
Chiu et al.

(10) Patent No.: US 10,872,861 B2
(45) Date of Patent: Dec. 22, 2020

(54) SEMICONDUCTOR PACKAGES

(71) Applicant: Advanced Semiconductor Engineering, Inc., Kaohsiung (TW)

(72) Inventors: Yong-Da Chiu, Kaohsiung (TW); Shiu-Chih Wang, Kaohsiung (TW); Shang-Kun Huang, Kaohsiung (TW); Ying-Ta Chiu, Kaohsiung (TW); Shin-Luh Tarng, Kaohsiung (TW); Chih-Pin Hung, Kaohsiung (TW)

(73) Assignee: ADVANCED SEMICONDUCTOR ENGINEERING, INC. KAOHSIUNG, TAIWAN, Kaohsiung (TW)

( * ) Notice: Subject to any disclaimer, the term of this patent is extended or adjusted under 35 U.S.C. 154(b) by 0 days.

(21) Appl. No.: 15/891,305

(22) Filed: Feb. 7, 2018

(65) Prior Publication Data
US 2019/0244909 A1 Aug. 8, 2019

(51) Int. Cl.
*H01L 23/532* (2006.01)
*H01L 23/00* (2006.01)
*H01L 23/498* (2006.01)

(52) U.S. Cl.
CPC .. *H01L 23/53233* (2013.01); *H01L 23/49827* (2013.01); *H01L 23/53238* (2013.01); *H01L 24/06* (2013.01); *H01L 24/13* (2013.01); *H01L 24/11* (2013.01); *H01L 2224/0345* (2013.01); *H01L 2224/0401* (2013.01); *H01L 2224/1147* (2013.01); *H01L 2224/11825* (2013.01); *H01L 2224/11831* (2013.01); *H01L 2224/13147* (2013.01); *H01L 2224/13541* (2013.01); *H01L 2224/13562* (2013.01); *H01L 2224/13647* (2013.01); *H01L 2224/16* (2013.01); *H01L 2224/16235* (2013.01); *H01L 2224/16238* (2013.01); *H01L 2224/81191* (2013.01); *H01L 2224/81193* (2013.01); *H01L 2224/81895* (2013.01); *H01L 2225/1058* (2013.01); *H01L 2924/14* (2013.01); *H01L 2924/161* (2013.01); *H05K 2201/03* (2013.01); *H05K 2201/09481* (2013.01)

(58) Field of Classification Search
CPC ......... H01L 23/53233; H01L 23/53238; H01L 2924/161; H01L 2924/14; H01L 2224/16; H01L 24/06
See application file for complete search history.

(56) References Cited

U.S. PATENT DOCUMENTS

| | | | |
|---|---|---|---|
| 8,444,868 B2 | 5/2013 | Cheng et al. | |
| 2001/0004550 A1* | 6/2001 | Passemard | H01L 21/7681 438/618 |
| 2004/0003873 A1* | 1/2004 | Chen | C22F 1/02 148/518 |
| 2006/0091536 A1* | 5/2006 | Huang | H01L 24/05 257/734 |
| 2006/0270227 A1 | 11/2006 | Lin et al. | |

(Continued)

*Primary Examiner* — Ahmed N Sefer
(74) *Attorney, Agent, or Firm* — Foley & Lardner LLP

(57) ABSTRACT

A semiconductor package includes an electrical connection structure. The electrical connection structure includes: a first conductive layer; a second conductive layer on the first conductive layer; and a conductive cap between the first conductive layer and the second conductive layer, the conductive cap having a hardness greater than a hardness of the first conductive layer.

16 Claims, 9 Drawing Sheets

(56) References Cited

U.S. PATENT DOCUMENTS

| | | | |
|---|---|---|---|
| 2007/0148944 A1* | 6/2007 | Lee | H01L 21/7684 438/597 |
| 2012/0196435 A1* | 8/2012 | Terada | H01L 21/02126 438/627 |
| 2015/0061115 A1* | 3/2015 | Chen | H01L 24/13 257/737 |
| 2016/0172321 A1* | 6/2016 | Gao | H01L 24/13 257/737 |
| 2016/0276560 A1* | 9/2016 | Obata | H01L 33/38 |
| 2018/0053737 A1* | 2/2018 | Ogawa | H01L 24/49 |

* cited by examiner

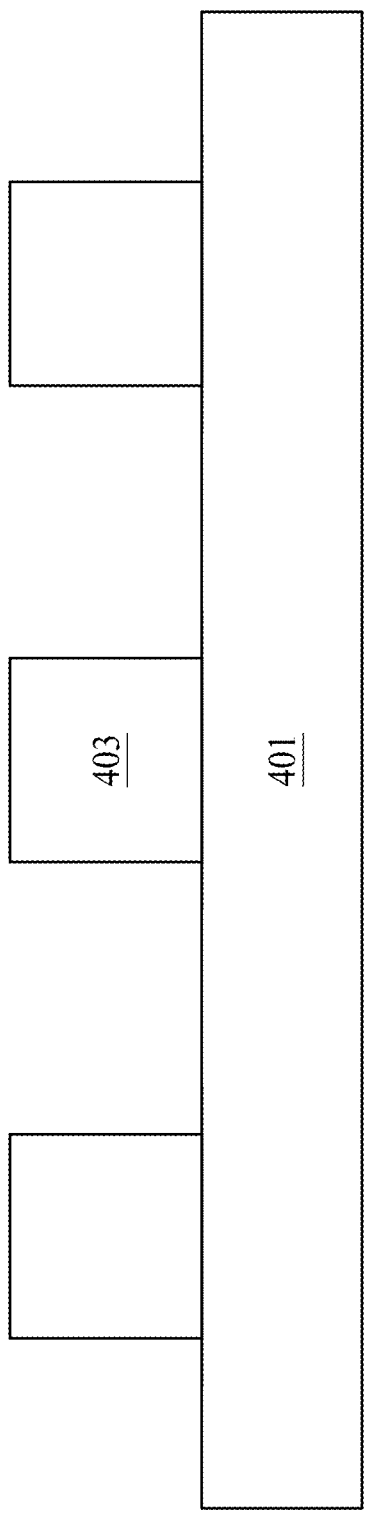

SEMICONDUCTOR PACKAGES

BACKGROUND

1. Technical Field

The present disclosure generally relates to semiconductor packages, and more particularly relates to semiconductor packages including an electrical connection structure having an improved shear strength.

2. Description of Related Art

Copper to copper (Cu-to-Cu) bonding technique may have advantages of avoiding the use of solder material or avoiding formation of intermetallic compound (IMC). However, it is challenging to improve or enhance bonding force of a bonding structure formed by the Cu-to-Cu bonding technique.

SUMMARY

In some embodiments, a conductive cap (or cup) with a relatively greater hardness is applied to top and side or lateral surfaces of a conductive layer to be bonded to another conductive layer. The conductive cap with a greater hardness can result in improved shear strength in an interface between the bonded layers.

In some embodiments, a semiconductor package is provided. The semiconductor package includes an electrical connection structure. The electrical connection structure includes: a first conductive layer; a second conductive layer on the first conductive layer; and a conductive cap between the first conductive layer and the second conductive layer, the conductive cap having a hardness greater than a hardness of the first conductive layer.

In some embodiments, a semiconductor package is provided. The semiconductor package includes: a substrate; a first conductive layer on the substrate, the first conductive layer including grains of a first average size; a second conductive layer on the first conductive layer, the second conductive layer including grains of a second average size; and a cap layer covering a first surface of the first conductive layer and a second surface of the first conductive layer, the cap layer including grains of a third average size; wherein the third average size is smaller than both the first average size and the second average size.

In some embodiments, a method of forming an electrical connection structure is provided. The method includes: providing a first conductive layer; forming a conductive cap on the first conductive layer, a hardness of the conductive cap being greater than a hardness of the first conductive layer; and bonding a second conductive layer to the conductive cap.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

FIG. 4A, FIG. 4B, FIG. 4C, FIG. 4D, and FIG. 4E schematically illustrate operations for manufacturing an electrical connection structure in accordance with some embodiments of the present disclosure.

DETAILED DESCRIPTION

Figure 1:
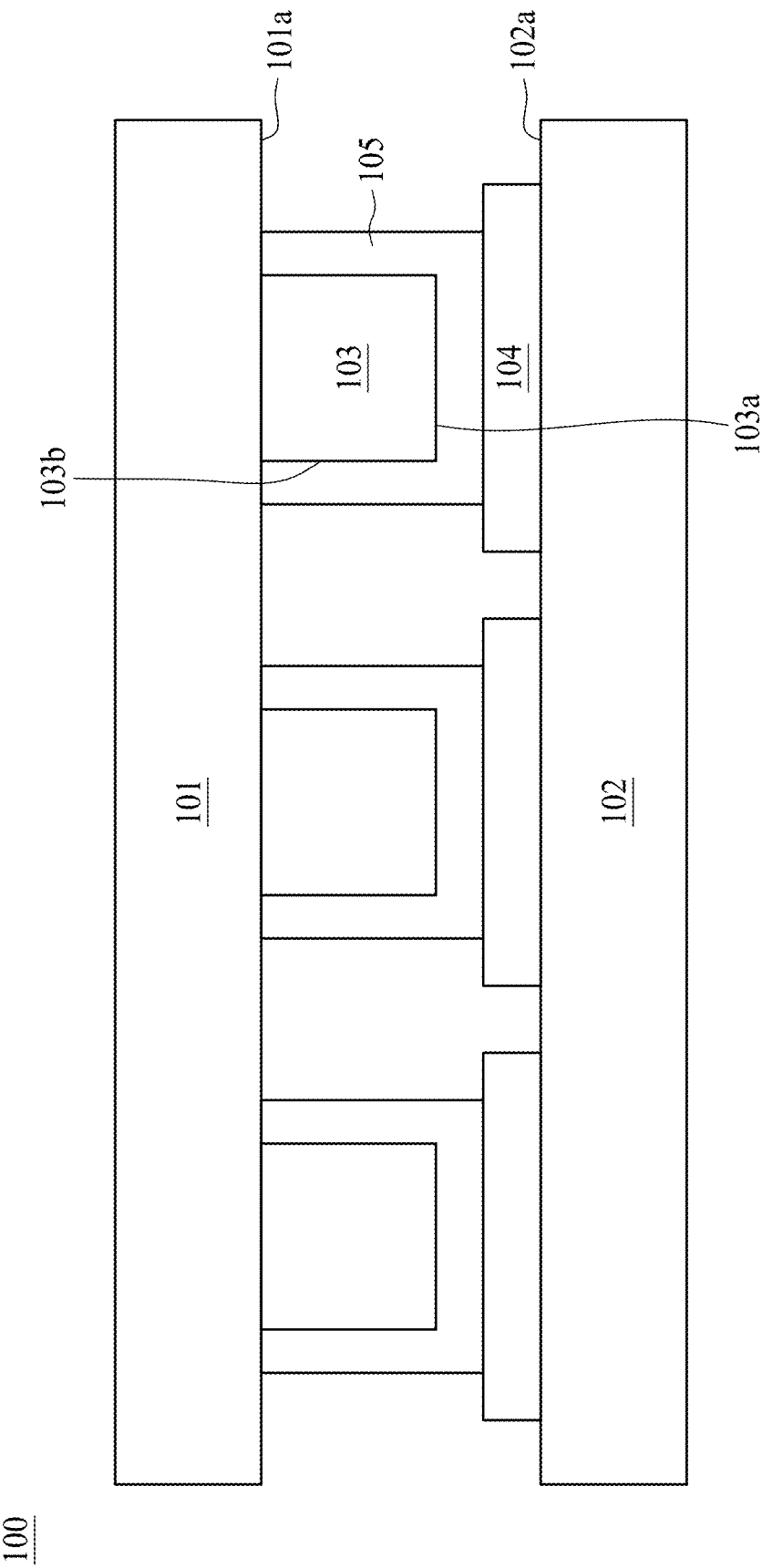
FIG. 1 is a cross-sectional view of an electrical connection structure in accordance with some embodiments of the present disclosure.

Structures, manufacturing and use of some embodiments of the present disclosure are discussed in detail below. It should be appreciated, however, that some embodiments set forth have many applicable concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Some embodiments, or examples, illustrated in the figures are disclosed below using specific language. It will nevertheless be understood that the embodiments and examples are not intended to be limiting. Any alterations and modifications of some of the disclosed embodiments, and any further applications of the principles disclosed in this document, as would normally occur to one of ordinary skill in the pertinent art, fall within the scope of this disclosure.

Further, it is understood that several processing stages (e.g., operations) and/or features of a device may be briefly described. Also, additional processing stages and/or features can be added, and certain of the processing stages and/or features described herein can be removed or changed while implementing the methods described herein or while using the systems and devices described herein. Thus, the following description should be understood to represent examples, and are not intended to indicate that one or more stages or features are included for every implementation.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (e.g., rotated 90 degrees or at other orientations) and the spatially relative descriptors used herein may be interpreted accordingly.

FIG. 1 is a cross-sectional view of an electrical connection structure 100 in accordance with some embodiments of the present disclosure. The electrical connection structure 100 includes a carrier 101 and a carrier 102. A plurality of conductive pillars (e.g., posts, bumps, or other conductive layers or structures) 103 are provided on the carrier 101. The plurality of conductive pillars 103 may be disposed on a surface 101a of the carrier 101. A plurality of conductive pads 104 (or other conductive layers or structures) are provided on the carrier 102. Each of the plurality of conductive pillars 103 is aligned with a corresponding conductive pad 104. The plurality of conductive pads 104 may be disposed on a surface 102a of the carrier 102.

The electrical connection structure 100 further includes a plurality of conductive caps 105. Each of the plurality of conductive caps 105 is provided between a conductive pillar 103 and a corresponding conductive pad 104. The conductive cap 105 is in direct contact with the conductive pillar 103. The conductive cap 105 is also in direct contact with the conductive pad 104. Specifically, the conductive pillar 103 and the corresponding conductive pad 104 are bonded together via the conductive cap 105 rather than a solder material.

A material of the conductive cap 105 is selected such that the conductive cap 105 has a greater hardness. Alternatively, or in conjunction, a manufacturing process of the conductive cap 105 is designed such that the conductive cap 105 has a greater hardness. The hardness of the conductive cap 105 may be greater than a hardness of the conductive pillar 103, such as at least about 1.1 times or greater, at least about 1.3 times or greater, or at least about 1.5 times or greater than the hardness of the conductive pillar 103. The hardness of the conductive cap 105 may be greater than a hardness of the conductive pad 104, such as at least about 1.1 times or greater, at least about 1.3 times or greater, or at least about 1.5 times or greater than the hardness of the conductive pad 104. The hardness of the conductive cap 105 may be greater than both the hardness of the conductive pillar 103 and the hardness of the conductive pad 104. In some embodiments, the hardness of the conductive cap 105 is at least or greater than about 1 GPa (indentation hardness according to Vickers hardness test in SI units), such as about 1.2 GPa or greater, about 1.5 GPa or greater, about 1.8 GPa or greater, or about 2 GPa or greater. In some embodiments, the hardness of the conductive cap 105 is up to or smaller than about 3.5 GPa. In some embodiments, the hardness of the conductive cap 105 ranges from about 1.2 GPa to about 3.1 GPa. The conductive pillar 103, the conductive pad 104 and the conductive cap 105 may be formed of a same conductive material (e.g., having a same elemental composition). The conductive pillar 103, the conductive pad 104 and the conductive cap 105 may be formed of copper (with the conductive cap 105 being formed of copper having a greater hardness). The conductive pillar 103, the conductive pad 104 and the conductive cap 105 may be formed of another metal or metal alloy, and may be formed of different conductive materials.

In some embodiments, the conductive cap 105 is formed as a conductive cup (cup-shaped conductive structure). The conductive cup covers an upper surface 103a of the conductive pillar 103 (facing toward the conductive pad 104) and a lateral surface 103b of the conductive pillar 103, where the upper surface 103a and the lateral surface 103b are nonparallel surfaces, and the lateral surface 103b intersects the upper surface 103a and is oriented at a nonzero angle relative to the upper surface 103a (e.g., substantially perpendicular). The conductive cup surrounds exterior surfaces of the conductive pillar 103 (including the upper surface 103a and the lateral surface 103b) and defines an inner cavity accommodating the conductive pillar 103 and within which the conductive pillar 103 is disposed. The conductive cup may include a conductive film or a cap layer conformally formed on the upper surface 103a of the conductive pillar 103 and on the lateral surface 103b of the conductive pillar 103. In some embodiments, a thickness of the conductive film is at least or greater than about 0.1 such as about 0.3 μm or greater, or about 0.5 μm or greater. In some embodiments, the thickness of the conductive film is at least or greater than about 1 such as about 1.1 μm or greater, or about 1.2 μm or greater.

Figure 2:
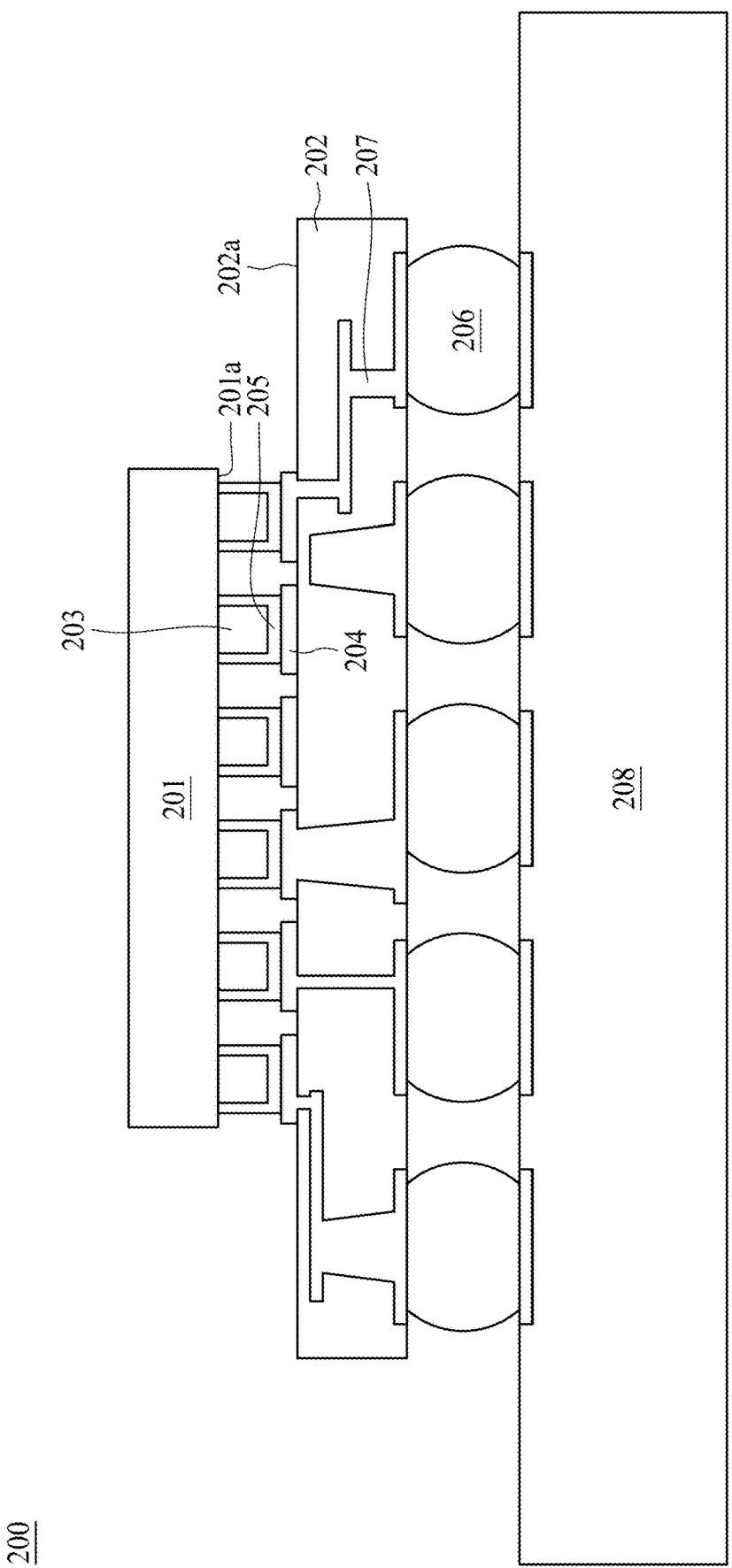
FIG. 2 is a cross-sectional view of a semiconductor package including an electrical connection structure in accordance with some embodiments of the present disclosure.

The carrier 101 may be a semiconductor chip (or die), an interposer or a package substrate. Similarly, the carrier 102 may be a semiconductor chip, an interposer or a package substrate. FIG. 2 is a cross-sectional view of a semiconductor package 200 including an electrical connection structure in accordance with some embodiments of the present disclosure. The semiconductor package 200 includes a semiconductor chip 201 and an interposer 202. A plurality of copper pillars 203 are provided on a surface 201a of the semiconductor chip 201. A plurality of copper pads 204 are provided on the interposer 202. Each of the plurality of copper pillars 203 is aligned with a corresponding copper pad 204. The plurality of copper pads 204 may be disposed on a surface 202a of the interposer 202. The semiconductor package 200 further includes a plurality of copper caps 205 provided between the copper pillars 203 and the copper pads 204. The copper pillars 203 and the copper pads 204 are bonded together via the copper caps 205. The copper pads 204 are electrically coupled to solder bumps 206 through interconnection structures 207 in the interposer 202. The solder bumps 206 are electrically coupled to a package substrate 208.

Figure 3A:
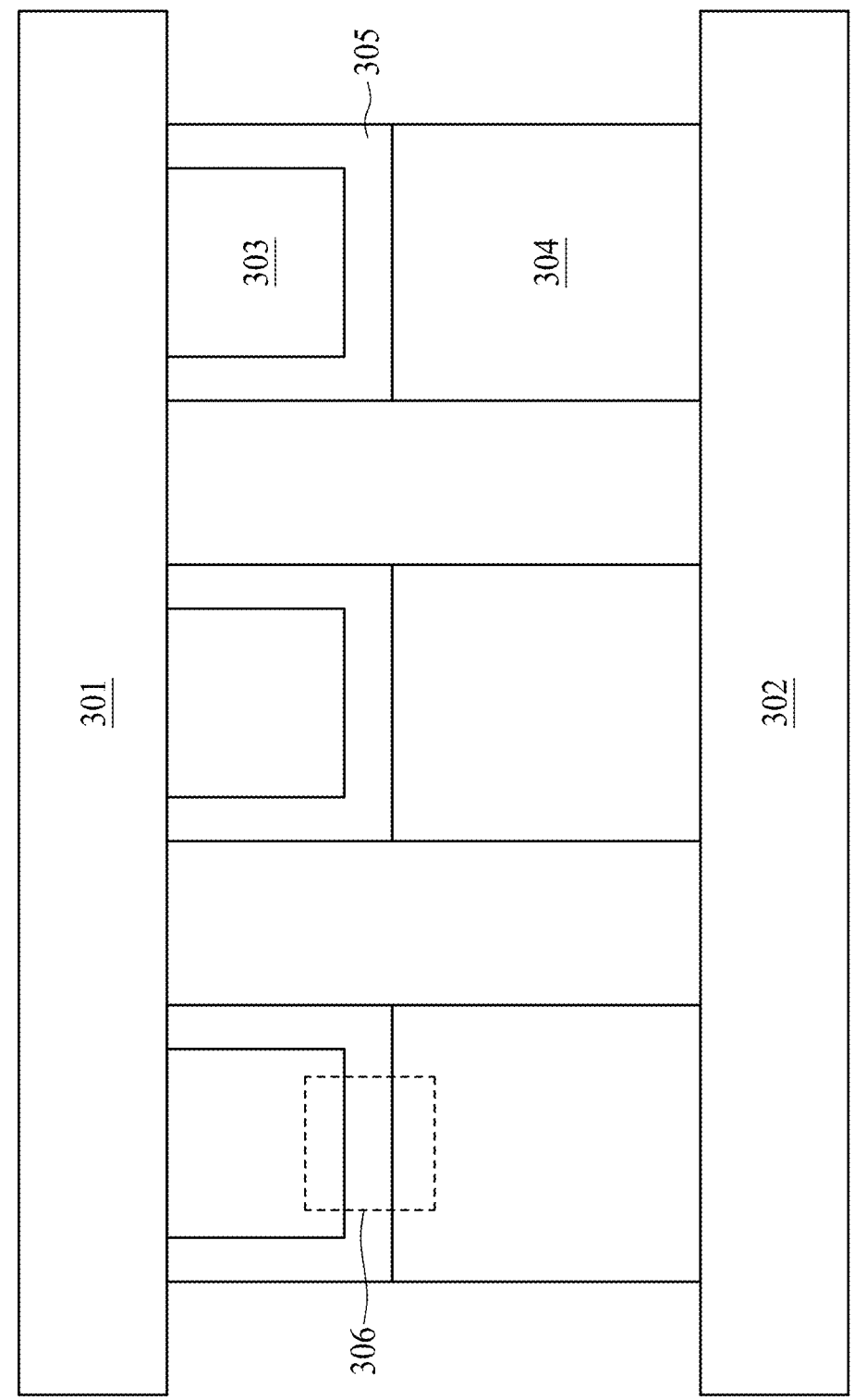
FIG. 3A, FIGS. 3B, and 3C are cross-sectional views of an electrical connection structure in accordance with some embodiments of the present disclosure.

FIG. 3A is a cross-sectional view of an electrical connection structure 300 in accordance with some embodiments of the present disclosure. The electrical connection structure 300 includes a carrier 301 and a carrier 302. A plurality of copper pillars 303 are provided on the carrier 301. A plurality of copper pillars 304 are provided on the carrier 302. The electrical connection structure 300 further includes a plurality of copper caps 305 provided between the copper pillars 303 and the copper pillars 304. The copper pillars 303 and the copper pillars 304 are bonded together via the copper caps 305.

The copper pillars 303 include grains of a first average size. The copper pillars 304 include grains of a second average size. The copper caps 305 include grains of a third average size. In some embodiments, the third average size is smaller than the first average size, such as about 0.9 times or less, about 0.8 times or less, or about 0.7 times or less of the first average size. In some embodiments, the third average size is smaller than the second average size, such as about 0.9 times or less, about 0.8 times or less, or about 0.7 times or less of the second average size. In some embodiments, the third average size is smaller than both the first average size and the second average size. In some embodiments, the first average size is substantially the same as the second average size. In some embodiments, the first average size is different from the second average size.

Figure 3B:
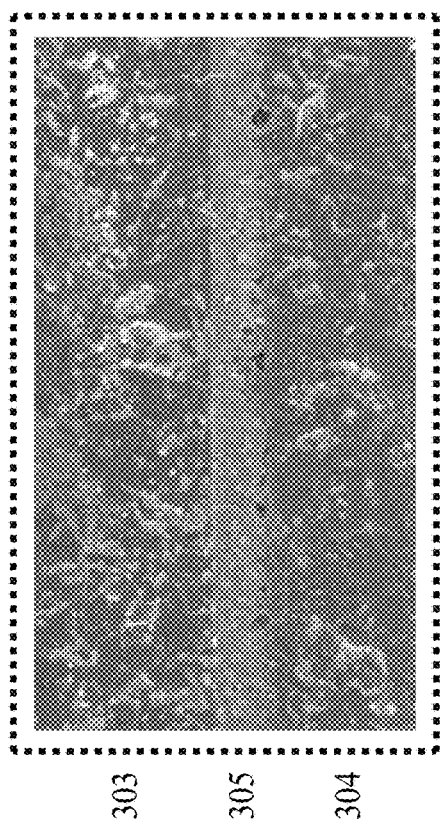
Figure 3C:
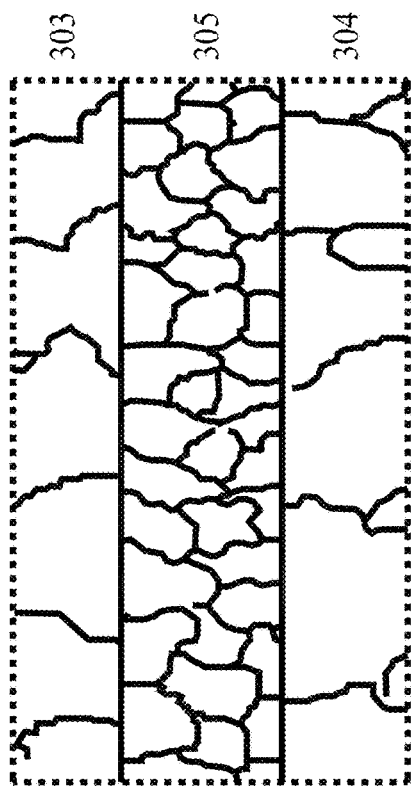

FIG. 3B and FIG. 3C show a portion of the electrical connection structure 300 in FIG. 3A as indicated by a dashed rectangular block labeled 306. As can be seen, the third average grain size of the copper cap 305 is smaller than both the first average grain size of the copper pillar 303 and the second average grain size of the copper pillar 304. A bonding force between the copper pillar 304 and the copper cap 305 is greatly enhanced due to the difference in the average size of grains. In some embodiments, a number of grains of the copper cap 305 contacting the copper pillar 303 is greater than a number of grains of the copper pillar 303 contacting the copper cap 305. In some embodiments, a number of grains of the copper cap 305 contacting the copper pillar 304 is greater than a number of grains of the copper pillar 304 contacting the copper cap 305.

FIG. 4A through FIG. 4E schematically illustrate operations for manufacturing an electrical connection structure in accordance with some embodiments of the present disclosure.

In FIG. 4A, a carrier 401 is provided. The carrier 401 is provided with a plurality of copper pillars 403. The formation of the copper pillars 403 on the carrier 401 may include the following stages: sputtering an under bump metallization (UBM) layer on the carrier 401, applying a photoresist layer on the UBM layer, patterning the photoresist layer to form openings that expose the underlying UBM layer, filling the openings with copper, stripping the remaining photoresist layer and etching undesired portions of the UBM layer.

Figure 4B:
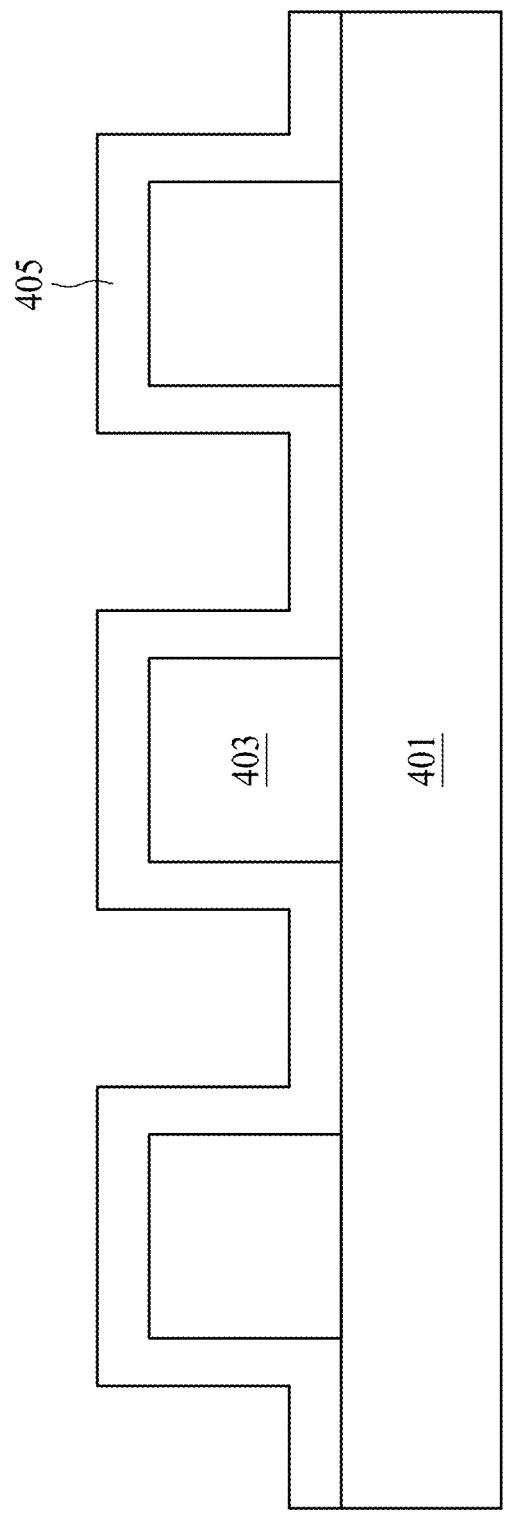

In FIG. 4B, a copper film 405 with an enhanced hardness is applied onto an upper surface of the carrier 401 by electroplating. The copper film covers upper surfaces and lateral surfaces of the copper pillars 403. The electroplating is performed in an electrolyte solution with one or more additives that can enhance the hardness of the copper film 405 to be electroplated. These additives can include sulfur-containing compounds (e.g., organosulfur compounds added as hardening agents to the electrolyte solution, in a concentration at or below about 10 ml/L. The hardness of the electroplated copper film 405 generally increases as the concentration of an additive increases. For example, with a concentration of the additive being about 2 ml/L, the hardness of the electroplated copper film 405 is about 1.98 GPa; with a concentration of the additive being about 6 ml/L, the hardness of the electroplated copper film 405 is about 2.86 GPa; and with a concentration of the additive being about 10 ml/L, the hardness of the electroplated copper film 405 is about 3.05 GPa. It should be noted that when the concentration is above 10 ml/L, there is no further significant increase in the hardness of the electroplated copper film 405 as compared to the hardness using the concentration of about 10 ml/L.

Figure 4C:
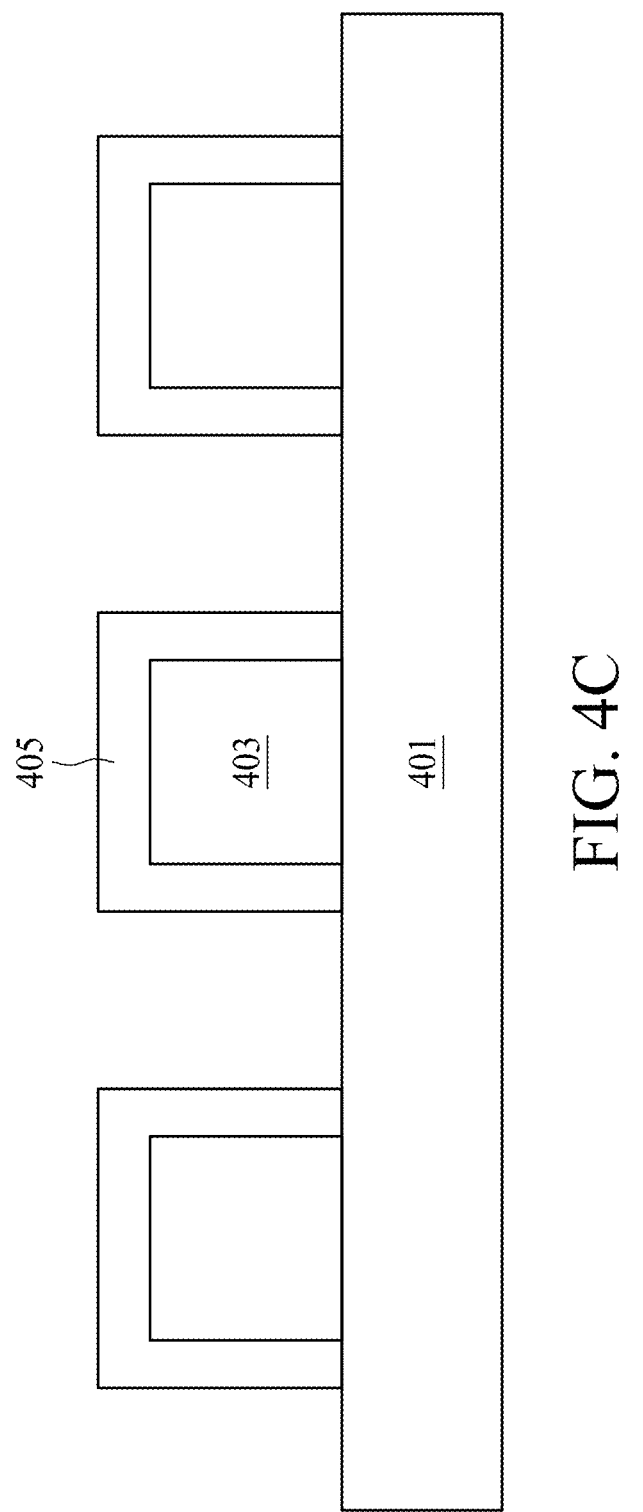

In FIG. 4C, a portion of the copper film 405 disposed on the carrier 401 is removed by etching.

Figure 4D:
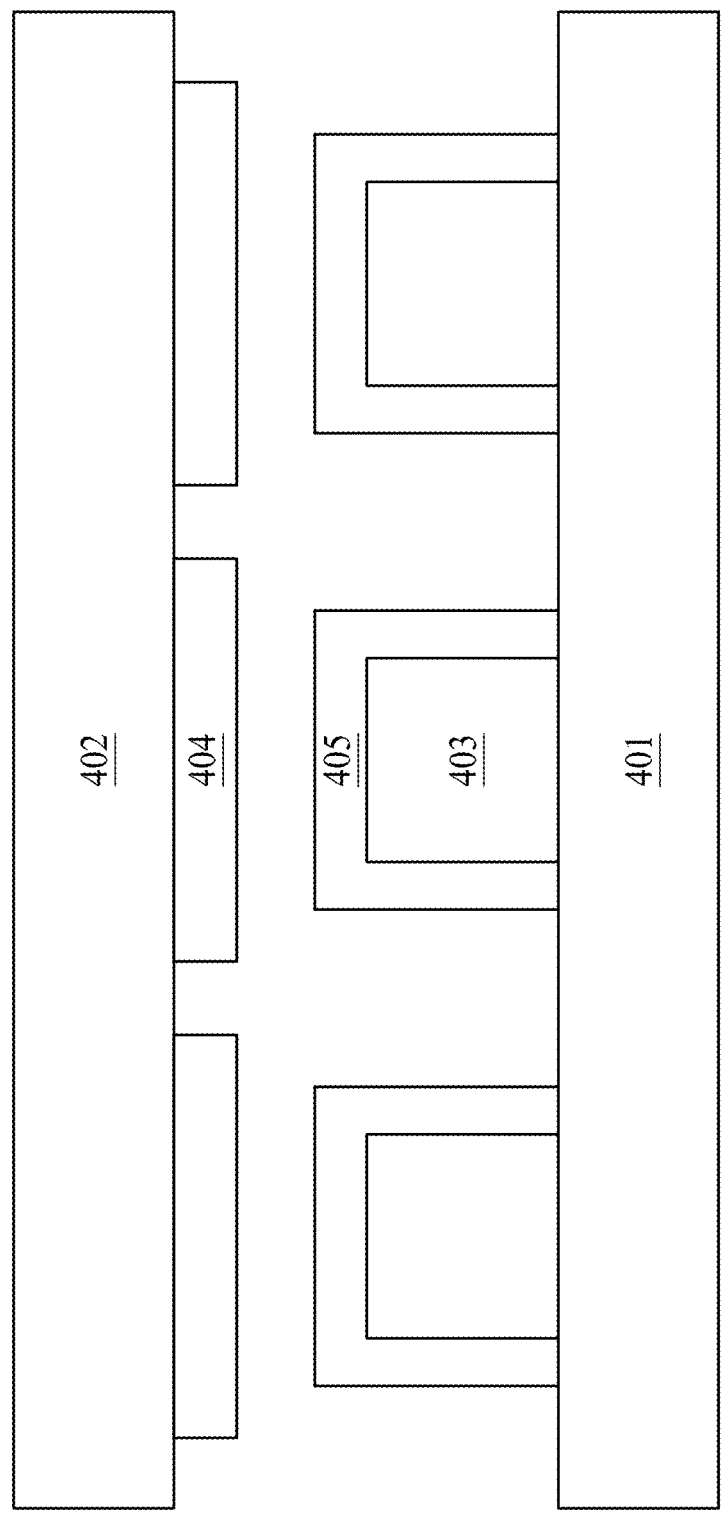

In FIG. 4D, a carrier 402 is provided. The carrier 402 is provided with a plurality of copper pads 404. The copper pads 404 are aligned with the copper pillars 403.

Figure 4E:
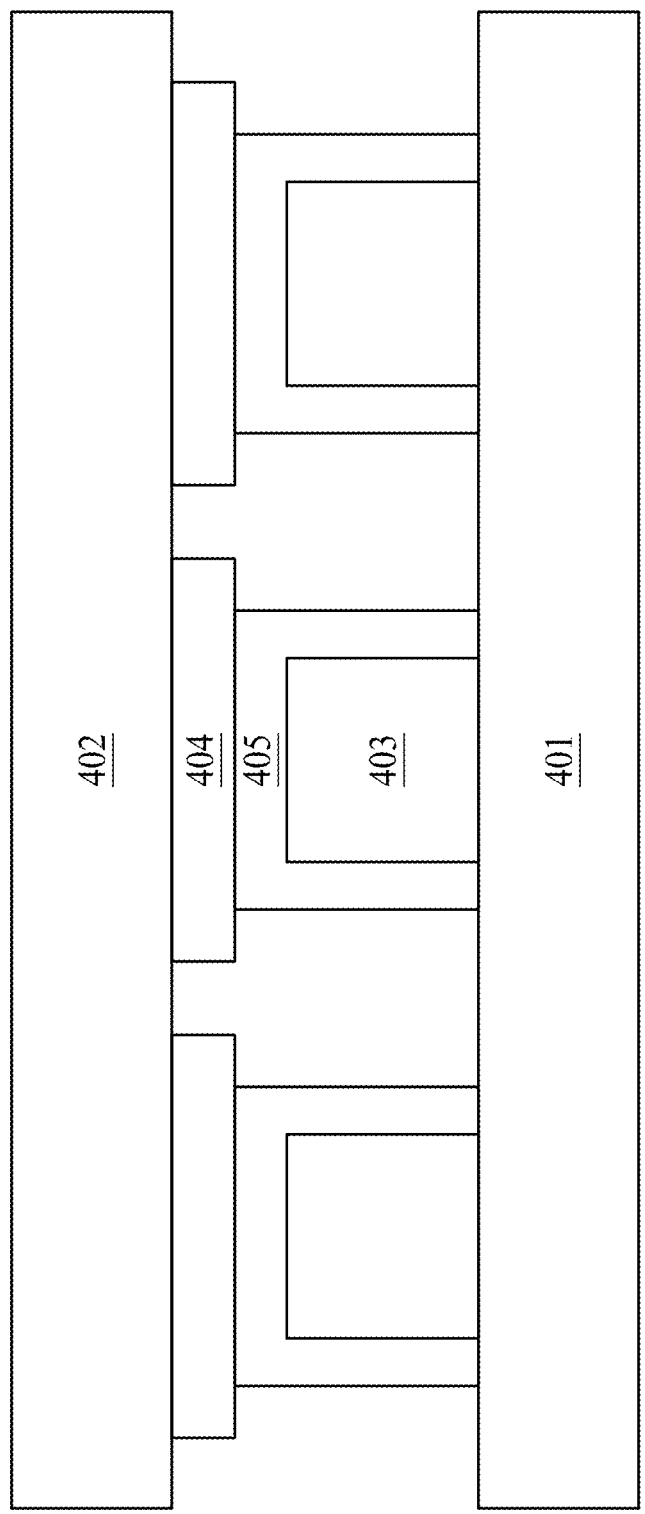

In FIG. 4E, the copper pads 404 are bonded to the copper film 405 by direct copper-to-copper bonding techniques (e.g., diffusion bonding). The bonding may be performed under specified bonding conditions. The bonding conditions include, for example, a temperature between about 200 to about 250° C. and a pressure between about 15 to about 20 MPa. Since the copper film 405 has an enhanced hardness, the bonding between the copper film 405 and the copper pads 404 results in improved shear strength at an interface between the copper film 405 and the copper pads 404, thus efficiently mitigating against peeling at the interface.

In the description of some embodiments, a component provided or disposed "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the terms "approximately," "substantially," "substantial," "around" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electrical connection structure, comprising:
   a first conductive layer;
   a second conductive layer; and
   a conductive cup between the first conductive layer and the second conductive layer, the conductive cup having a hardness about one and a half times greater than a hardness of the first conductive layer, and the hardness of the conductive cup ranges from about 1.2 GPa to about 3.1 GPa and is about one and a half times greater than a hardness of the second conductive layer,
   wherein the first conductive layer and the conductive cup both include copper.

2. The electrical connection structure according to claim 1, wherein the conductive cup covers a first surface of the first conductive layer and a second surface of the first conductive layer, and the first surface is oriented at a nonzero angle relative to the second surface.

3. The electrical connection structure according to claim 2, wherein the conductive cup is a conductive film conformally formed on the first surface and the second surface of the first conductive layer.

4. The electrical connection structure according to claim 3, wherein a thickness of the conductive film is at least about 0.1 µm.

5. The electrical connection structure according to claim 3, wherein a thickness of the conductive film is at least about 1 µm.

6. A semiconductor package, comprising:
   a substrate;
   a first conductive layer on the substrate, the first conductive layer including a first plurality of grains;
   a second conductive layer on the first conductive layer, the second conductive layer including a second plurality of grains; and
   a cup layer between the first conductive layer and the second conductive layer, the cup layer comprising a third plurality of grains,
   wherein a number of the third plurality of grains contacting the first conductive layer is greater than a number of the first plurality of grains contacting the cup layer,
   the cup layer has a hardness about one and a half times greater than a hardness of the first conductive layer,
   the hardness of the cup lay ranges from about 1.2 GPa to about 3.1 GPa and is about one and a half times greater than a hardness of the second conductive layer, and
   the first conductive layer and the cup layer both include copper.

7. The semiconductor package according to claim 6, wherein a number of the third plurality of grains contacting the second conductive layer is greater than a number of the second plurality of grains contacting the cup layer.

8. The semiconductor package according to claim 6, wherein a third average size of the third plurality of grains is smaller than both a first average size of the first plurality of grains and a second average size of the second plurality of grains.

9. The semiconductor package according to claim 6, wherein the first conductive layer, the second conductive layer and the cup layer include a same elemental composition.

10. The semiconductor package according to claim 6, wherein the second conductive layer and the cup layer include a same metal.

11. The semiconductor package according to claim 6, wherein the second conductive layer includes copper.

12. The semiconductor package according to claim 6, wherein a first surface of the first conductive layer is oriented at a nonzero angle relative to a second surface of the first conductive layer.

13. The semiconductor package according to claim 6, wherein a first surface of the first conductive layer is substantially perpendicular to a second surface of the first conductive layer.

14. A method of forming an electrical connection structure, comprising:
   providing a first conductive layer;
   forming a conductive cup on the first conductive layer, a hardness of the conductive cup being about one and a half times greater than a hardness of the first conductive layer, wherein the first conductive layer and the conductive cup both include copper; and
   bonding a second conductive layer to the conductive cup, wherein the hardness of the conductive cup ranges from about 1.2 GPa to about 3.1 GPa and is about one and a half times greater than a hardness of the second conductive layer.

15. The method according to claim 14, wherein forming the conductive cup on the first conductive layer includes plating a copper film on the first conductive layer.

16. The method according to claim 14, wherein bonding the second conductive layer to the conductive cup is performed under conditions of a temperature in a range from about 200° C. to about 250° C. and a pressure in a range from about 15 MPa to about 20 MPa.

* * * * *